United States Patent [19]

Parris et al.

[11] Patent Number: 5,604,700
[45] Date of Patent: Feb. 18, 1997

[54] NON-VOLATILE MEMORY CELL HAVING A SINGLE POLYSILICON GATE

[75] Inventors: Patrice M. Parris; Yee-Chaung See, both of Phoenix, Ariz.

[73] Assignee: Motorola, Inc., Schaumburg, Ill.

[21] Appl. No.: 506,989

[22] Filed: Jul. 28, 1995

[51] Int. Cl.$^6$ .................................................. G11C 11/34
[52] U.S. Cl. .......................... 365/185.1; 365/94; 365/156; 365/185.33
[58] Field of Search .................................. 365/94, 185.1, 365/185.33, 103, 104, 156

[56] References Cited

U.S. PATENT DOCUMENTS

| | | |
|---|---|---|
| 4,649,520 | 3/1987 | Eitan . |
| 4,924,278 | 5/1990 | Logie . |
| 5,027,171 | 6/1991 | Reedy et al. ............................. 257/318 |
| 5,301,150 | 4/1994 | Sullivan et al. .................... 365/185.33 |
| 5,455,788 | 10/1995 | Clark ......................................... 365/94 |
| 5,465,231 | 11/1995 | Ohsaki ................................... 365/185.1 |

OTHER PUBLICATIONS

A. Watts, "Unique Cell Design Gives High EEPROM Endurance," Electronic Engineering, Jul. 1992, pp. 13–16.
K. Ohsaki et al., "A Single Poly EEPROM Cell Structure for Use in Standard CMOS Processes," IEEE, Journal of Solid-State Circuits, vol. 29, No. 3, Mar. 1994, pp. 311–316.

Primary Examiner—David C. Nelms
Assistant Examiner—F. Niranjan
Attorney, Agent, or Firm—Bruce T. Neel

[57] ABSTRACT

A non-volatile memory cell (10) is provided employing two transistors (11, 12) connected in series. A floating gate structure (13), formed with a single polysilicon deposition, is shared by each transistor (11, 12) to store the logic condition of the memory cell (10). To program and erase the memory cell (10), a voltage potential is placed on the floating gate (13) which modulates the transistors (11, 12) so only one is conducting during read operations. The gate capacitance of the transistors (11, 12) is used to direct the movement of electrons on or off the floating gate structure (13) to place or remove the stored voltage potential. The two transistor memory cell (10) couples one of two voltage potentials as the output voltage so no sense amp or buffer circuitry is required. The memory cell (10) can be constructed using traditional CMOS processing methods since no additional process steps or device elements are required.

19 Claims, 3 Drawing Sheets

5,604,700

NON-VOLATILE MEMORY CELL HAVING A SINGLE POLYSILICON GATE

BACKGROUND OF THE INVENTION

The present invention relates, in general, to non-volatile memory devices, and more particularly to a memory cell incorporating a single polysilicon floating gate structure.

Electrically Erasable Programmable Read Only Memories (EEPROM's) are well known and well used in the art. They provide a method for storing data that can be retained even if power to the memory is removed. Most EEPROM's store charge on an electrically isolated floating gate which is used to control the state of a single transistor. The two focal points of EEPROM designs involve how to place a voltage potential on an isolated floating gate and how to determine the state of the single transistor.

There are two common approaches for isolating a floating gate structure and capacitively coupling the floating gate so it can be programmed or erased. The first approach uses a double dielectric/conductor stack to form a floating gate between two dielectric layers which is controlled by a second conductor referred to as a control gate. The control gate is used to place a voltage potential on the floating gate to control movement of charge to and from the floating gate. When the voltage is removed from the control gate, the trapped charge will remain to provide a stored voltage potential in the memory cell. The structure requires the formation of two conductive layers which is typically accomplished with two polysilicon depositions.

The second approach for isolating a floating gate structure uses a single polysilicon layer to form a capacitor to the substrate. One portion of the capacitor is the isolated gate of a single transistor and is used to provide the programming voltage on the isolated gate. The capacitor electrically separates the isolated gate from the rest of the circuit and controls the movement of electrons to and from the isolated gate through the dielectric layer of the capacitor.

To determine the state of the single transistor, we need to determine if the transistor is conducting at one of two levels. Typically if the transistor is 'on' this is to be interpreted as a logic '1' and if the transistor is off a logic '0' is assumed or vice versa. Such techniques rely on sense amp circuitry to determine which logic level the current of the read transistor implies. Then once the logic condition is determined by the sense amp, a read voltage must be generated to serve as the output of the memory cell.

With most EEPROM designs, the above mentioned considerations add complexity to traditional CMOS process and design procedures. Additional process steps are required to form the double polysilicon stack or complications may arise with the addition of high voltage potentials for EEPROM's in close proximity to traditional CMOS devices. The addition of sense amp and read voltage circuitry will also consume valuable layout space which will increase the cost of the final product.

Accordingly, it would be advantageous to provide a structure for a non-volatile memory cell which can be constructed from a single polysilicon deposition such that the floating gate structure can be formed during the same process steps that form the gate structures for common CMOS devices. It would be of further advantage to form an EEPROM cell which is capable of generating a read voltage that does not require the use of sense amp or buffer circuitry and could be formed using the traditional constraints of a CMOS process flow without any additional process steps.

DETAILED DESCRIPTION OF THE DRAWINGS

Electrically Erasable Programmable Read Only Memories (EEPROM's) have become widely used in the semiconductor industry because of their ability to store data even if power to the memory is removed. Such memory cells are termed non-volatile and rely on storing a voltage potential on an isolated floating gate structure. The floating gate structure is typically used as a gate for a transistor where the stored voltage potential is sufficient to enable or disable that transistor. Circuitry is added to the memory cell which determines the status of the read transistor and provides a logic '1' or logic '0' during read operations.

In the present invention a structure is provided having a single polysilicon gate which uses a polysilicon layer to form a floating gate which is shared by two transistors. This two transistor structure will obviate the need for sense amp circuitry and simplify the process steps required to construct a EEPROM memory cell. Using the same process steps which form CMOS transistors, it is also possible to form a non-volatile memory cell which adds functionality to the circuit with no added process costs.

Figure 1:
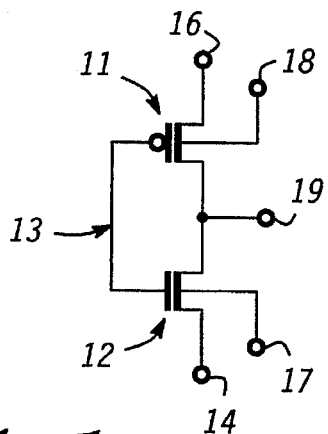
FIGS. 1–3 are schematic representations of memory cells according to the present invention.

Since the present invention can be constructed along with the formation of traditional Field Effect Transistors (FETs), a schematic presentation will be provided to describe a method of forming a non-volatile memory cell. FIG. 1 is an electrical schematic representation showing a first embodiment of the present invention. Non-volatile memory cell, EEPROM memory cell, or EEPROM memory device 10 comprises a NMOS device or n-channel transistor 12 and a PMOS device or p-channel transistor 11 connected in series.

One terminal of NMOS transistor 12 is electrically coupled to one terminal of PMOS transistor 11 to provide an output read voltage at output node 19. The other terminal of NMOS transistor 12 is connected to input terminal 14 and the other terminal of PMOS transistor 11 is connected to input terminal 16. NMOS transistor 12 and PMOS transistor 11 may be formed in well or substrate regions that require electrical contact to voltage potentials to provide biasing during read, programming, or erasing operation. Contact to a p-well or p-substrate of NMOS transistor 12 is accomplished with substrate terminal 17. Contact to a n-well or n-substrate of PMOS transistor 11 is accomplished with substrate terminal 18.

The voltage present at output node 19 will depend on the state of NMOS transistor 12 and PMOS transistor 11 which are both controlled by a floating gate structure 13. Floating gate 13 is either electrically connected to or acts as the gate structure which modulates the operation of NMOS transistor 12 and PMOS transistor 11. The charge present on floating gate 13 determines which of the two transistors is conducting. The threshold voltage of each transistor is predetermined to ensure that only one of the two transistors dominates to provide the output voltage. Ideally, only one transistor would be conducting to provide the output voltage, while the other is completely disabled.

During normal read operation of memory cell 10, the voltage potential present at output node 19 will be used to determine the value of the data stored in memory cell 10. If floating gate structure 13 has a voltage potential greater than or equal to the threshold voltage of NMOS transistor 12, then output node 19 will have a voltage potential approximately equal to the voltage present at input terminal 14. If the voltage present on floating gate 13 turns PMOS transistor 11 on, then output node 19 will be electrically connected to input terminal 16. It should be apparent to someone skilled in the art that if input terminals 14 and 16 are connected to opposite power supply potentials (Vdd and Vss) used in the circuit, then memory cell 10 will provide a voltage potential that can be used directly by other CMOS devices without any amplification. Since two transistors are used to form memory cell 10, it is possible to determine the logic level stored without the use of sense amp or buffer circuitry to generate a read voltage. If the output voltage is directly connected to the gate of a traditional CMOS transistor, then memory cell 10 will provide the stored logic value without any current drain. As a result, memory cell 10 can be added to a CMOS circuit with minimal power consumption.

To program memory cell 10, electrons must be attracted to and trapped on floating gate 13. There are two mechanisms that can be used to program floating gate 13; Fowler-Nordheim Tunneling and Hot Carrier Injection (HCI). The capacitive gate structures of NMOS transistor 12 and PMOS transistor 11 are used to place a voltage potential on floating gate 13. The capacitive nature of a transistor comes from the gate oxide layer which is formed between a conductive control or polysilicon layer and the semiconductor substrate. Disregarding parasitic capacitances, memory cell 10 can be modeled as two capacitors connected in series between input terminals 14 and 16. A voltage potential ($V_{fg}$) will be placed on floating gate 13 by the voltage divider circuit comprising a capacitance C1 of NMOS transistor 12 and a capacitance C2 of PMOS transistor 11. The voltage ($V_{fg}$) on floating gate 13 is equal to the voltage potential present between input terminals 14 and 16 ($V_{12}$) times a ratio of the capacitance value of each gate structure ($C_1$ and $C_2$) approximated by the formula:

$$V_{fg}=V_{12}*(C_2/(C_1+C_2))$$

The size and thickness of the gate oxide layer of each transistor can be adjusted to vary the capacitance value of each gate structure. By controlling the capacitance value of NMOS transistor 12 and PMOS transistor 11 we can then determine the voltage potential present on floating gate 13 to control the movement of electrons.

It should be evident to someone skilled in the art that memory cell 10 with two transistors can be programmed with several combinations of various voltage potentials at the terminals of each transistor. One such combination for using NMOS transistor 12 for programming would place input terminal 14 and substrate terminal 17 at a ground potential, leave output node 19 floating, and place input terminal 16 and substrate terminal 18 at a positive programing voltage relative to input terminal 14 such as 7 volts to 21 volts. The above mentioned condition will then employ Fowler-Nordheim tunneling across NMOS transistor 12 to store charge on floating gate structure 13.

With the preceding programing technique, PMOS transistor 11 is fabricated to have the larger capacitance value so a large programming potential is present across the gate structure of NMOS transistor 12. According to the above mentioned formula, if the capacitance, C1, of NMOS transistor 12 is smaller than the capacitance, C2, of PMOS transistor 11, then the voltage potential ($V_{fg}$) will be greater than 50% of the voltage potential between input terminals 14 and 16 ($V_{12}$). Therefore the voltage between the source of NMOS transistor 12 and floating gate 13 will be greater than the voltage between floating gate 13 and the source of PMOS transistor 11. Consequently, more electrons will tunnel onto floating gate 13 through the gate of NMOS transistor 12 than will leave floating gate 13 by tunneling through the gate of PMOS transistor 11. This will produce a net charge on floating gate 13 which will program memory cell 10.

To use HCI to program floating gate structure 13, substrate terminal 17 and output node 19 are placed at a ground potential, input terminal 16 is left floating, input terminal 14 is connected to Vdd, and a positive programming voltage relative to the ground potential is placed on substrate terminal 18. As electrons conduct between the source and drain of NMOS transistor 12, the voltage potential on floating gate 13 will attract and trap hot electrons. The capacitance values of NMOS transistor 12 and PMOS transistor 11 should be sized so a large programming potential is present across the gate structure of NMOS transistor 12.

Erasing of memory cell 10 is performed by removing the previously stored charge from floating gate 13. Fowler-Nordheim tunneling is used to remove the electrons through the gate structure of either transistor. Again various combinations of voltage potentials can be used by those skilled in the art and one such method will be provided here. To use NMOS transistor 12 for erasing, substrate terminals 17 and 18 are placed at a ground potential, input terminal 16 and output terminal 19 are left floating, and a larger erasing voltage potential relative to the ground potential is placed on input terminal 14 such as 7 volts to 21 volts. Electrons trapped on floating gate 13 will tunnel through the gate oxide of NMOS transistor 12 and leave memory cell 10 through input terminal 14.

Figure 2:
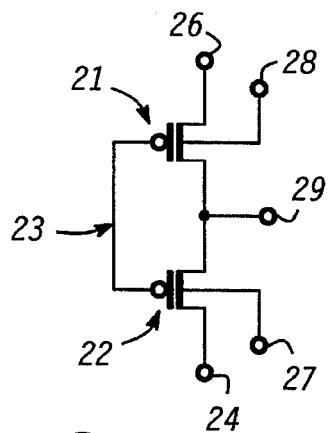

FIG. 2 is an electrical schematic representation showing a second embodiment of the present invention. Non-volatile memory cell, EEPROM memory cell, or EEPROM memory device 20 is comprised of two PMOS devices or p-channel transistors 21 and 22 connected in series. Floating gate 23 is used to modulate which of the two transistors is conducting to provide the voltage potential at either input terminal 24 or 26 as a read voltage to output node 29. PMOS transistors 21 and 22 are fabricated to have different threshold voltages so only one is dominantly enabled during a read operation to provide the output voltage. To provide biasing to each device, the substrate or well may be connected to a voltage potential with substrate terminals 27 and 28.

Figure 3:
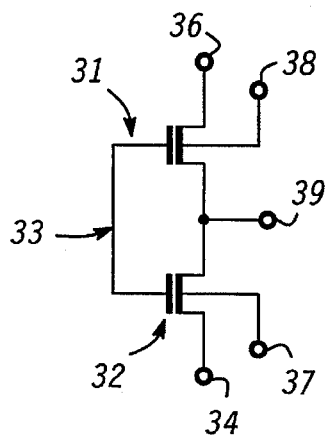

FIG. 3 is an electrical schematic representation showing a third embodiment of the present invention. Non-volatile memory cell, EEPROM memory cell, or EEPROM memory device 30 is comprised of two NMOS devices or n-channel transistors 31 and 32 connected in series. Floating gate 33 is used to modulate which of the two transistors is conducting to provide the voltage potential at either input terminal 34 or 36 as a read voltage to output node 39. NMOS transistors 31 and 32 are fabricated to have different threshold voltages so only one is dominantly enabled during a read operation to provide the output voltage. To provide biasing to each device, the substrate or well may be connected to a voltage potential with substrate terminals 37 and 38.

In the second and third embodiments of the present invention, output nodes 29 and 39 can be formed from the same region in the substrate. Since the source and drain regions of both transistors are of the same conductivity, one doped region or two overlapping regions can be shared by both transistors. In some cases, the terms 'source' and 'drain' simply refer to the two terminals of a transistor and is not meant to imply a particular current direction or voltage potential at either terminal of a transistor. The same techniques for programming and erasing memory cell 10 can be used to program memory cells 20 and 30. It will be obvious to one skilled in the art, that all embodiments may require different voltage potentials to program and erase depending upon the exact dimensions, doping levels, and desired performance characteristics.

In both the second and third embodiments of the present invention, non-complementary transistors may be formed. The channel region of transistors 21 and 22, or 31 and 32, are of the same conductivity with threshold voltages that are either both positive or both negative. As a result, one of the program states for memory cell 20 or 30, will have both transistors conducting. When floating gate 23 or 33 is at the threshold voltage of the first transistor 21 or 31, only one of the transistors will be conducting to provide the output read voltage. After memory cell 20 or 30 is programmed, both transistors will be conducting. To insure the proper voltage is place on output terminal 29 or 39, the size of one of the two transistors must be large enough to over ride and compensate for the current draw of the other transistor.

Figure 4:
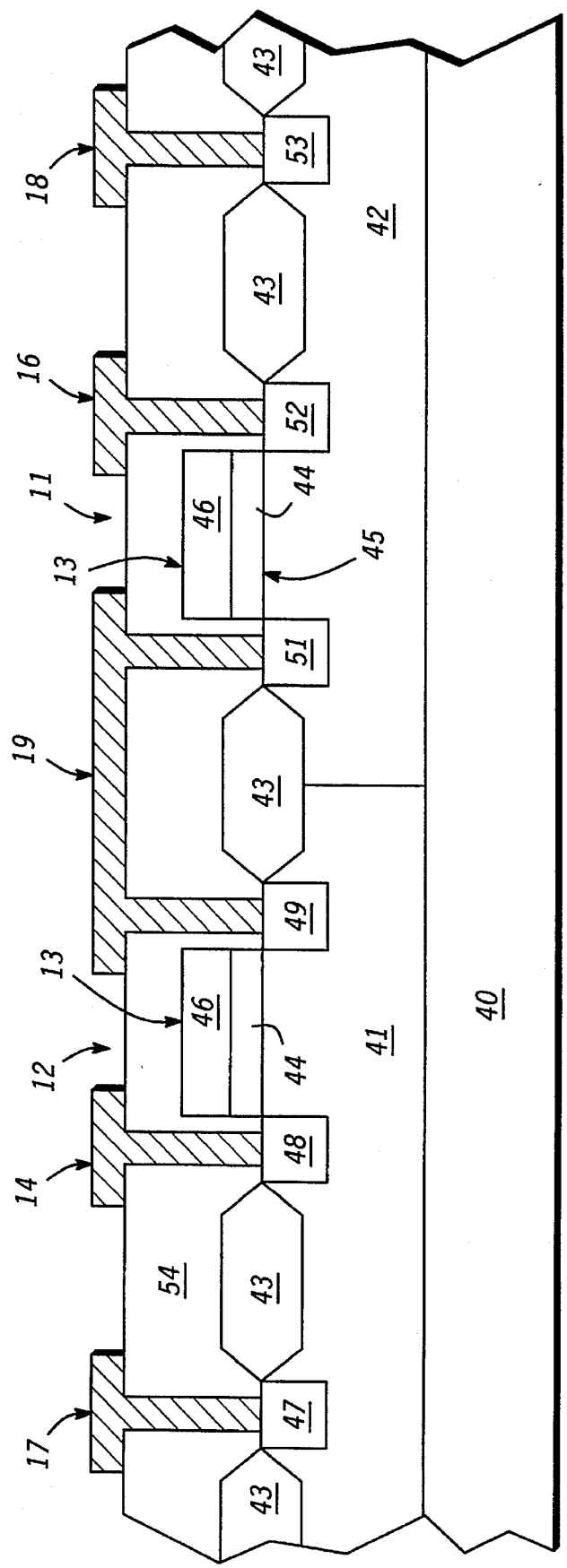
FIGS. 4–5 are enlarged cross-sectional representations of a memory cell according to the present invention.

FIG. 4 is an enlarged cross-sectional view of some elements of memory cell 10 of FIG. 1. NMOS transistor 12 and PMOS transistor 11 are formed on a semiconductor substrate, a region of semiconductor material, or a body of semiconductor material 40 using previously known processing techniques. P-well 41, N-well 42 and field oxide regions 43 are formed to electrically isolate NMOS transistor 12 and PMOS transistor 11. To provide biasing voltages, well contact region 47 is formed in P-well 41 and well contact region 53 is formed in N-well 42. Well contact regions 47 and 53 are of the same conductivity as the well in which they are formed.

Next, gate oxide 44 for transistors 11 and 12 is formed by growing a gate oxide on surface 45. Gate oxide 44 for transistors 11 and 12 can also be formed from two separate growth process. Such a technique could be used to vary the thickness of gate oxide 44 and thus the capacitance and threshold voltage of each transistor. To form floating gate structure 13, a single layer of polysilicon 46 is deposited on gate oxide 44 and then gate oxide 44 and polysilicon gate layer 46 are patterned and etched. Single polysilicon or polycide layer 46 can be doped with either a boron concentration or phosphorus concentration of $1\times10^{15}$ atoms/cm$^3$ to $1\times10^{22}$ atoms/cm$^3$. A source or source region 48 and a drain or drain region 49 for NMOS transistor 12 are formed in P-well 41. A source or source region 52 and a drain or drain region 51 for PMOS transistor 11 are formed in N-well 42. It is also possible to form source 52 and drain 51 before forming source 48 and drain 49.

Dielectric layer 54 is deposited on substrate 40 to provide electrical isolation between each element of EEPROM cell 10. Dielectric layer 54 is typically made from silicon dioxide which may be doped to protect memory cell 10 from stress and sodium migration. To form each of the electrical connections to memory cell 10, dielectric layer 54 is patterned and etched to expose portions of each region. Using metalization techniques known by those skilled in CMOS processing, electrical contact is made to well contact region 47 to form substrate contact 17. Electrical contact is made to source 48 to form input terminal 14. Electrical contact is made to source 52 to form input terminal 16. Electrical contact is formed to well contact region 53 to form substrate terminal 18. Electrical contact between drain 49 and drain 51 is provided by a conductive region or a metalized region which also serves as output node 19.

Figure 5:
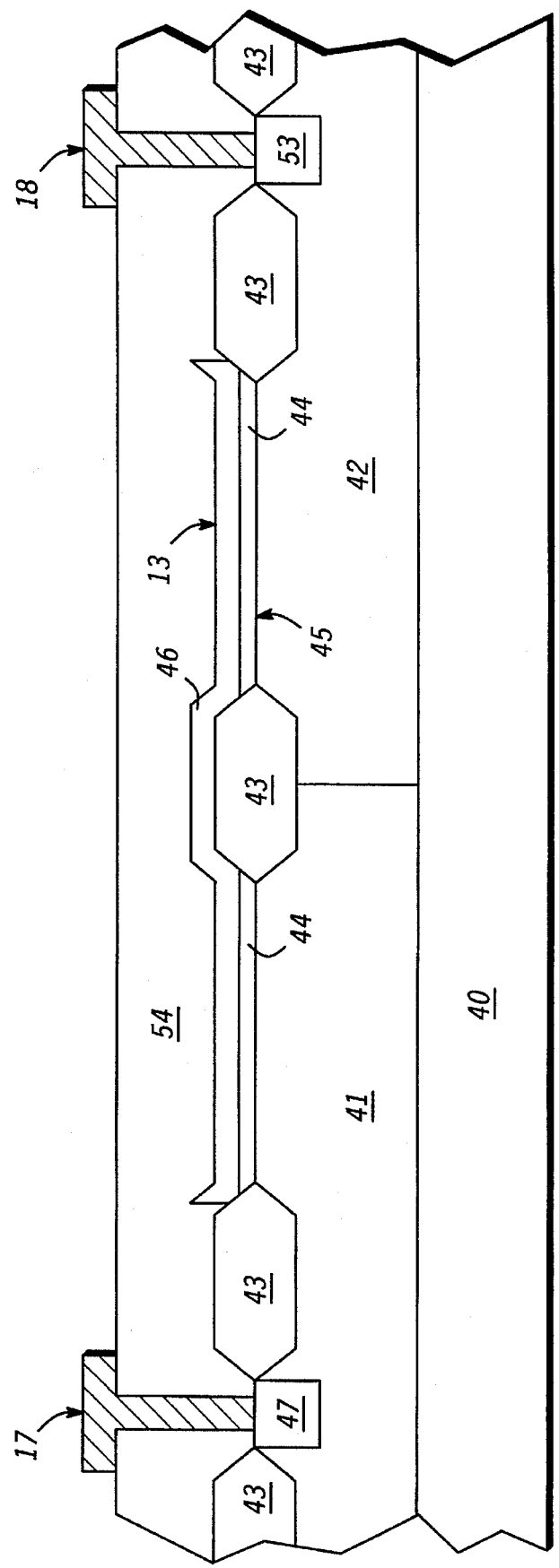

FIG. 5 is an enlarged cross-sectional view of some elements of memory cell 10. The cross-section of FIG. 5 is alternate view of the memory cell 10 and is provided to show how floating gate structure 13 can be connected to both transistors. FIG. 5 shows floating gate structure 13 made from gate oxide 44 and single polysilicon layer 46. Again the thickness of gate oxide 44 can be varied between each transistor to adjust the threshold voltage of the two transistors in memory cell 10. It is also possible to adjust the threshold voltage of the two transistors in memory cell 10 by varying punchthrough and Vt adjust implants during the formation of the two transistors. Such methods for adjusting the threshold voltage of a transistor with dopant implants are well known in the art.

By now it should be appreciated that the present invention provides a non-volatile memory cell formed with two transistors 11 and 12, 21 and 22, or 31 and 32 controlled by a common floating gate structure 13, 23, or 33 respectively. The above mentioned embodiments can be manufactured using conventional CMOS processing techniques well known in the art. The memory cell is formed such that only one of the two transistors dominates the transmission of the output voltage after the cell is programmed. Since each transistor is connected to a separate input voltage potential, memory cell 10 can provide the output voltage potential without the use of sense amp or buffer circuitry. Since memory cell 10 can be constructed along with a conventional CMOS circuit without any additional process steps, the functionality of a circuit can be improved without any additional processing cost or dynamic power consumption.

We claim:

1. A non-volatile memory cell having a single polysilicon gate comprising:

a body of semiconductor material;

a first transistor having a source and a drain formed in the semiconductor material, wherein the drain of the first transistor provides a first read voltage when the first transistor is operating, the first transistor further having a first threshold voltage controlled by a first gate region;

a second transistor having a source and a drain formed in the semiconductor material, wherein the drain of the second transistor provides a second read voltage when the second transistor is operating, the second transistor further having a second threshold voltage controlled by a second gate region; and a floating gate structure connected to the first gate region and to the second gate region to provide the single polysilicon gate.

2. The non-volatile memory cell having a single polysilicon gate of claim 1 wherein the drain of the first transistor and the drain of the second transistor are electrically coupled by a metalized region.

3. The non-volatile memory cell having a single polysilicon gate of claim 1 wherein the drain of the first transistor and the drain of the second transistor overlap each other in the semiconductor material.

4. The non-volatile memory cell having a single polysilicon gate of claim 1 wherein the drain of the first transistor and the drain of the second transistor are formed from a common portion of the semiconductor material.

5. The non-volatile memory cell having a single polysilicon gate of claim 1 wherein the first transistor is a n-channel transistor and the second transistor is a p-channel transistor.

6. The non-volatile memory cell having a single polysilicon gate of claim 1 wherein the first transistor is a n-channel transistor and the second transistor is a n-channel transistor.

7. The non-volatile memory cell having a single polysilicon gate of claim 1 wherein the first transistor is a p-channel transistor and the second transistor is a p-channel transistor.

8. The non-volatile memory cell having a single polysilicon gate cell of claim 1 wherein the single polysilicon gate is doped to a first conductivity.

9. The non-volatile memory cell having a single polysilicon gate of claim 8 wherein the first conductivity is p-type.

10. The non-volatile memory cell having a single polysilicon gate of claim 9 wherein the first conductivity is provided by a boron concentration of $1\times10^{15}$ atoms/cm$^3$ to $1\times10^{22}$ atoms/cm$^3$.

11. The non-volatile .memory cell having a single polysilicon gate of claim 8 wherein the first conductivity is n-type.

12. The non-volatile memory cell having a single polysilicon gate of claim 11 wherein the first conductivity is provided by a phosphorus concentration of $1\times10^{15}$ atoms/cm$^3$ to $1\times10^{22}$ atoms/cm$^3$.

13. A non-volatile memory cell comprising:
- a semiconductor substrate having a first region and a second region;
- a n-channel transistor formed in the first region of the semiconductor substrate having a source region and a drain region disposed in the first region to form a first channel region;
- a first gate structure formed overlying a portion of the first channel region and capacitively coupled to the first channel region;
- a p-channel transistor formed in the second region having a source region and a drain region disposed in the second region to form a second channel region;
- a second gate structure formed overlying a portion of the second channel region and capacitively coupled to the second channel region;
- a floating gate structure electrically connecting the first gate structure and the second gate structure, wherein the floating gate structure modulates the first channel region and the second channel region; and
- a conductive region which electrically couples the drain region of the n-channel transistor and the drain region of the p-channel transistor.

14. The non-volatile memory cell of claim 13 wherein the floating gate structure is comprised essentially of polysilicon.

15. An EEPROM memory cell comprising:
- a region of semiconductor material;
- a first transistor with a drain region formed in the region of semiconductor material and having a first threshold voltage;
- a second transistor with a drain region formed in the region of semiconductor material and having a second threshold voltage, wherein the drain region of the first transistor is electrically connected to the drain region of the second transistor; and
- a floating gate connecting the first transistor and the second transistor, wherein the floating gate is capable of storing a voltage potential and is capacitively coupled to the region of semiconductor material.

16. The EEPROM memory cell of claim 15 wherein the drain region of the first transistor and the drain region of the second transistor are overlapping in the region of semiconductor material.

17. The EEPROM memory cell of claim 15 wherein the drain region of the first transistor operates as the drain region of the second transistor.

18. The EEPROM memory cell of claim 15 wherein the first threshold voltage varies from the second threshold voltage so that when a first voltage potential is placed on the floating gate, the first transistor will turn on and the second transistor will turn off.

19. The EEPROM memory cell of claim 15 wherein the first threshold voltage varies from the second threshold voltage so that when a second voltage potential is placed on the floating gate, the first transistor will turn off and the second transistor will turn on.

* * * * *

UNITED STATES PATENT AND TRADEMARK OFFICE
CERTIFICATE OF CORRECTION

PATENT NO. : 5,604,700
DATED : February 18, 1997
INVENTOR(S) : Patrice Parris
Yee-Chaung See It is certified that error appears in the above-indentified patent and that said Letters Patent is hereby corrected as shown below:

Claim 11, column 7, line 13
Delete "." before "memory".

Signed and Sealed this

First Day of July, 1997

Attest:

BRUCE LEHMAN

Attesting Officer

Commissioner of Patents and Trademarks